United States Patent
Ide et al.

(10) Patent No.: US 8,310,382 B2
(45) Date of Patent: Nov. 13, 2012

(54) SEMICONDUCTOR DEVICE HAVING PLURAL SEMICONDUCTOR CHIPS LAMINATED TO EACH OTHER

(75) Inventors: Akira Ide, Tokyo (JP); Ryuji Takishita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 97 days.

(21) Appl. No.: 12/923,826

(22) Filed: Oct. 8, 2010

(65) Prior Publication Data

US 2011/0057819 A1    Mar. 10, 2011

(30) Foreign Application Priority Data

Sep. 10, 2009    (JP) ................. 2009-235482

(51) Int. Cl.
 *H03M 9/00*    (2006.01)

(52) U.S. Cl. ...................... 341/100; 341/101

(58) Field of Classification Search .............. 341/100, 341/101; 257/686, 724
See application file for complete search history.

(56) References Cited

U.S. PATENT DOCUMENTS

| 7,489,030 | B2 | 2/2009 | Shibata et al. |
| 7,668,989 | B2 * | 2/2010 | Nonoyama et al. ............ 710/71 |
| 8,004,433 | B2 * | 8/2011 | Kawabata et al. ........... 341/101 |
| 8,144,039 | B2 * | 3/2012 | Morimitsu .................... 341/100 |
| 2010/0060310 | A1 | 3/2010 | Laisne et al. |

FOREIGN PATENT DOCUMENTS

JP    2007-158237 A    6/2007

* cited by examiner

*Primary Examiner* — Brian Young
(74) *Attorney, Agent, or Firm* — McGinn IP Law Group, PLLC

(57) ABSTRACT

In a stacked semiconductor device in which a plurality of through silicon vias used for data transfer are shared among a plurality of semiconductor chips, a first semiconductor chip included in the semiconductor chips holds through silicon via switching information for specifying a through silicon via among the through silicon vias to be used for data transfer, and transfers the through silicon via switching information to a second semiconductor chip included in the semiconductor chips. According to the present invention, because the through silicon via switching information is transferred from the first semiconductor chip to the second semiconductor chip, a circuit for storing the through silicon via switching information in a nonvolatile manner is not required in the second semiconductor chip. With this arrangement, a chip area of the second semiconductor chip can be reduced.

19 Claims, 11 Drawing Sheets

SEMICONDUCTOR DEVICE HAVING PLURAL SEMICONDUCTOR CHIPS LAMINATED TO EACH OTHER

BACKGROUND OF THE INVENTION

1. Field of the Invention

The present invention relates to a stacked semiconductor device, and more particularly relates to a stacked semiconductor device including a plurality of semiconductor chips electrically connected by through silicon vias.

2. Description of Related Art

A memory capacity required in semiconductor memory devices such as DRAM (Dynamic Random Access Memory) is increasing every year. In recent years, there has been proposed a method to meet this requirement. In this method, a plurality of memory chips are stacked and electrically connected via through silicon vias arranged on a silicon substrate (see Japanese Patent Application Laid-open No. 2007-158237).

Specifically, in a semiconductor memory device in which an interface chip having front end units such as interface circuits incorporated thereon and a core chip having back end units such as memory cores incorporated thereon are stacked, because read data that is read in parallel from the memory cores is supplied as it is to the interface chip without performing serial conversion, a large number of through silicon vias (approximately 4000 units in some cases) are required. However, the entire chip becomes defective when even one of the through silicon vias becomes defective, and if a plurality of the chips are stacked, all the chips become defective. Thus, to prevent the entire chip from becoming defective due to a defective through silicon via, auxiliary through silicon vias are sometimes provided in such semiconductor memory devices.

In the semiconductor device disclosed in Japanese Patent Application Laid-open No. 2007-158237, one auxiliary through silicon via is allocated to a group of through silicon vias constituted by a plurality of through silicon vias (for example, eight through silicon vias).

Further, because the through silicon vias are a type of wiring connecting a plurality of semiconductor chips, when there is a defective through silicon via, none of the semiconductor chips are allowed to use it, and this situation makes the use of an auxiliary through silicon via in place of the defective through silicon via essential. Therefore, it is essential to provide all the semiconductor chips with through silicon via switching information required for switching to the auxiliary through silicon via.

It is essential that the through silicon via switching information is nonvolatile information. However, when a circuit is provided in each of the semiconductor chips for storing the through silicon via switching information in a nonvolatile manner, it can lead to an increase in the chip area. This problem is not limited to semiconductor memory devices such as stacked DRAMs, but can occur to all stacked semiconductor devices in which a plurality of semiconductor chips are stacked and electrically connected to each other via through silicon vias.

SUMMARY

In one embodiment, there is provided a semiconductor device comprising: a plurality of semiconductor chips laminated to each other, the semiconductor chips including at least first and second semiconductor chips; and a plurality of through silicon vias (penetration electrodes) electrically connected in common to the plurality of semiconductor chips, wherein the first semiconductor chip stores switching information that specifies one or more of the through silicon vias to be used for data transfer, and the first semiconductor chip transfers the switching information to the second semiconductor chip.

According to the present invention, because through silicon via switching information is transferred from a first semiconductor chip to a second semiconductor chip, a circuit for storing the through silicon via switching information in a nonvolatile manner is not required in the second semiconductor chip. Therefore, a chip area of the second semiconductor chip can be reduced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
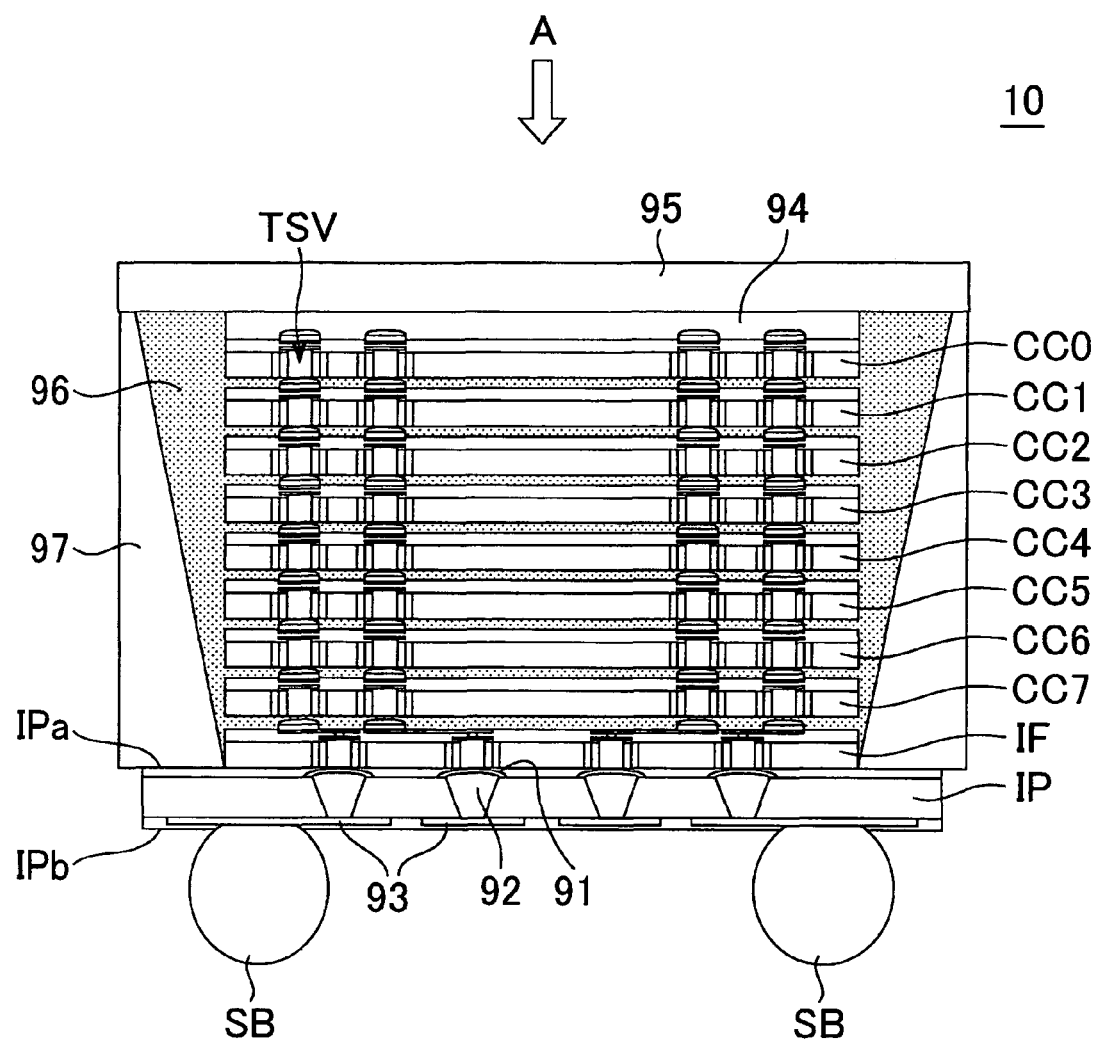
FIG. 1 is a schematic cross-sectional view for explaining the structure of a semiconductor memory device 10 according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same photo mask set, an interface chip IF that is manufactured using a photo mask set different from that of the core chips and an interposer IP are laminated. The core chips CC0 to CC7 and the interface chip IF are semiconductor chips using a silicon substrate and are electrically connected to adjacent chips in a vertical direction through plural through silicon vias TSV penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, plurality of external terminals are provided. The layout of the external terminals SB is the same as that of the DDR3-type SDRAM that is determined by the specification. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
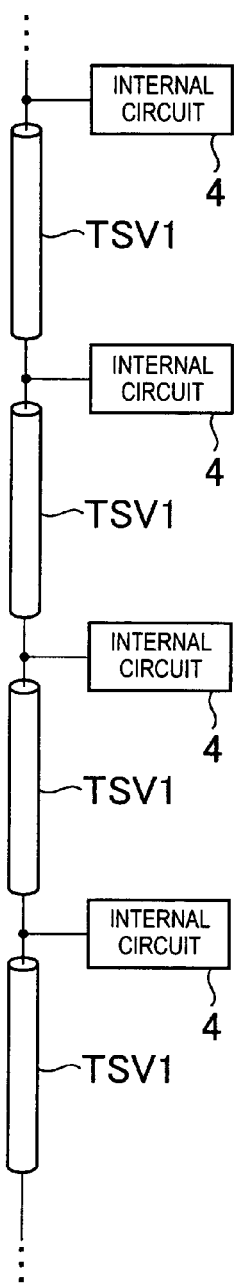
FIGS. 2A to 2C are diagram for explaining the various types of through silicon via TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon, vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 2B:
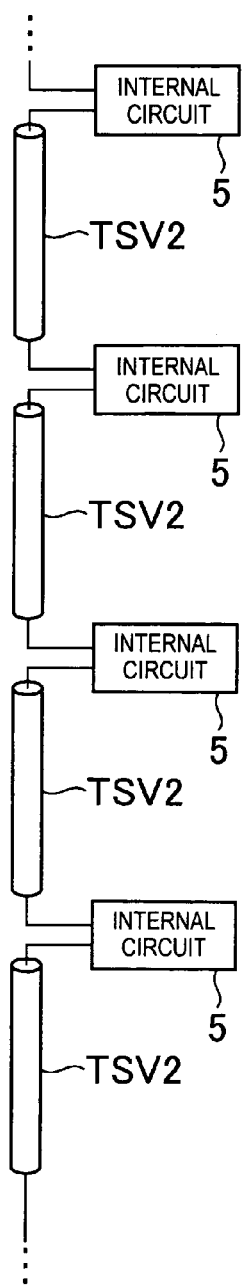

Meanwhile, as shown in FIG. 2B, the a part of through silicon vias are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, layer address information to be described below is exemplified.

Figure 2C:
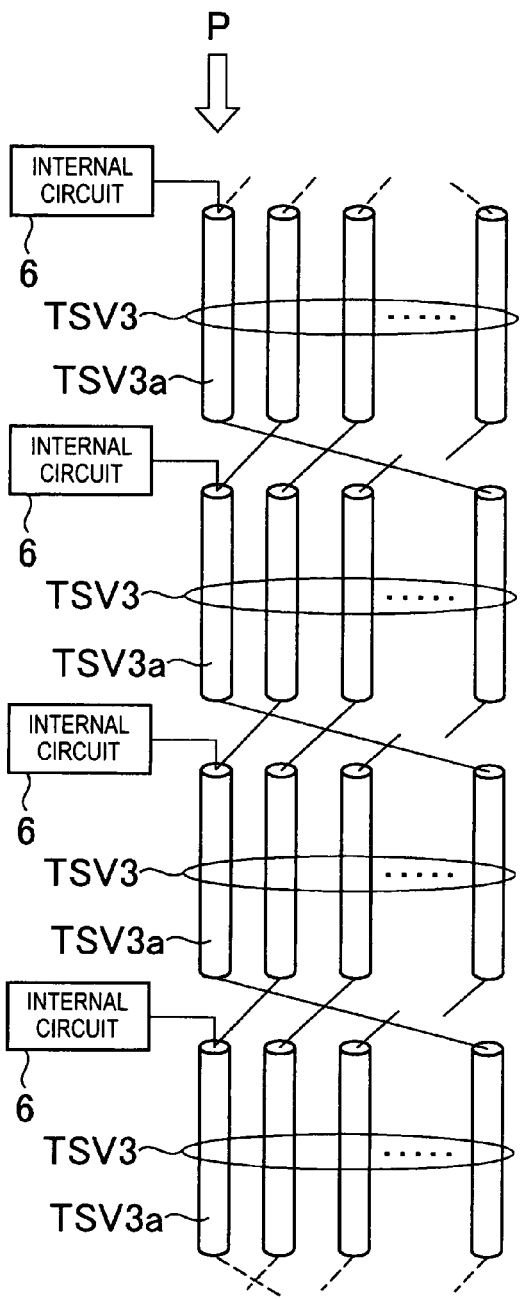

Another through silicon via group is short-circuited from the through silicon vias TSV of other layer provided at the different position in plan view, as shown in FIG. 2C. With respect to this kind of through silicon via group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal, a command signal, and a clock signal are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon via TSV2 and through silicon via TSV3 of the types shown in FIGS. 2B and 2C are used to provide individual information to the core chips CC0 to CC7 having the same structure.

Figure 3:
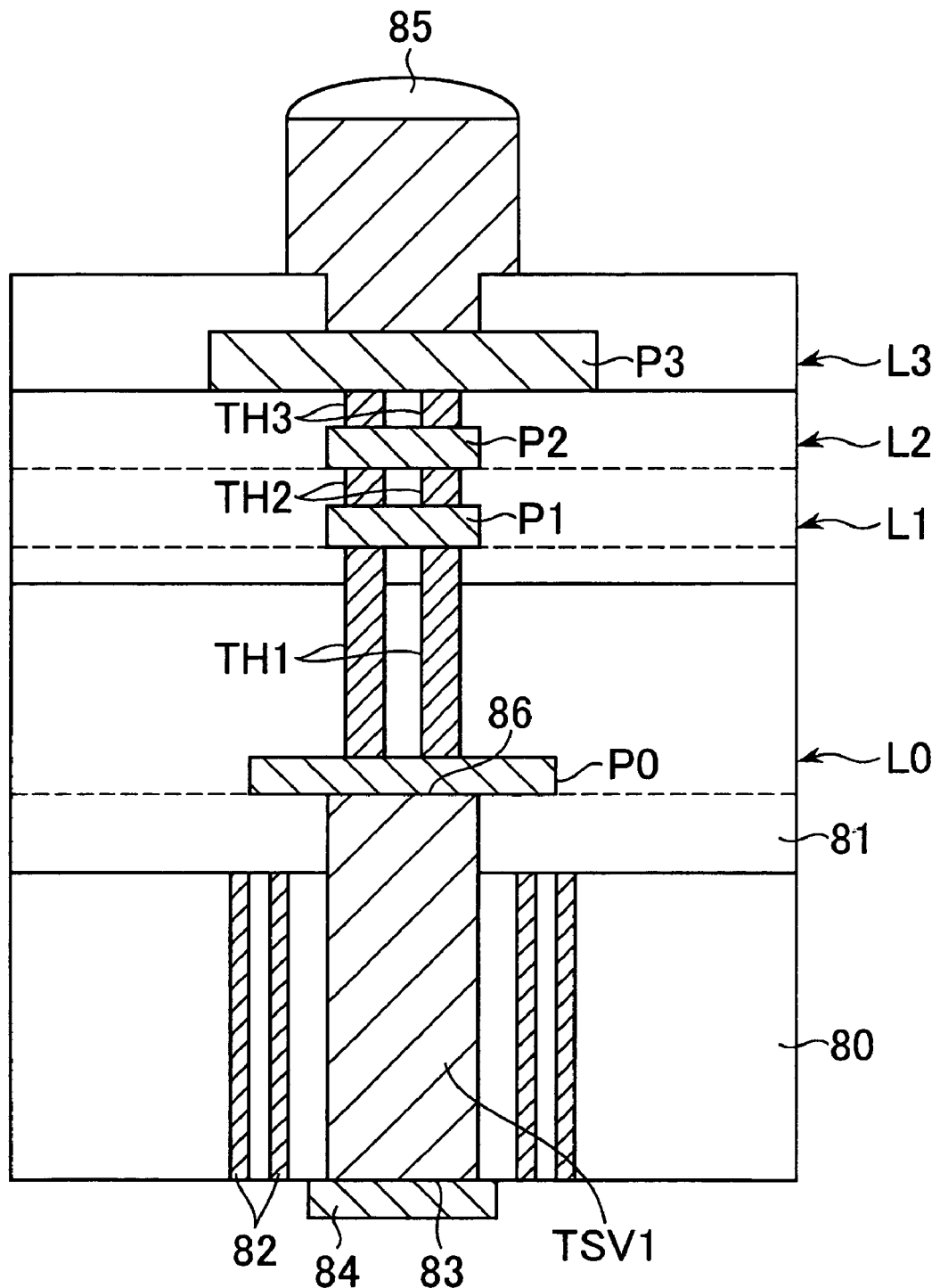
FIG. 3 is a cross-sectional view showing the structure of the through silicon via TSV1 of the type shown in FIG. 2A.

FIG. 3 is a cross-sectional view showing the structure of the through silicon via TSV1 of the type shown in FIG. 2A.

As shown in FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

In the through silicon via having such a structure, there is a certain probability of proneness to occurrence of failure, similarly to word lines and bit lines. Therefore, in the semiconductor memory device 10 according to the present embodiment, an auxiliary through silicon via is provided for a replacement of a defective through silicon via.

An auxiliary through silicon via is allocated to a group of through silicon vias. In the present embodiment, two auxiliary through silicon vias are allocated to a group of eight through silicon vias, although the numbers of them are not particularly limited to them. Therefore, when a defect occurs to not more than two through silicon vias of a group of through silicon vias, it is relieved by using the auxiliary through silicon vias allocated to that group in place of the defective through silicon vias. A switching circuit provided in each chip performs the switching operation of the through silicon vias based on through silicon via switching information.

Figure 4:
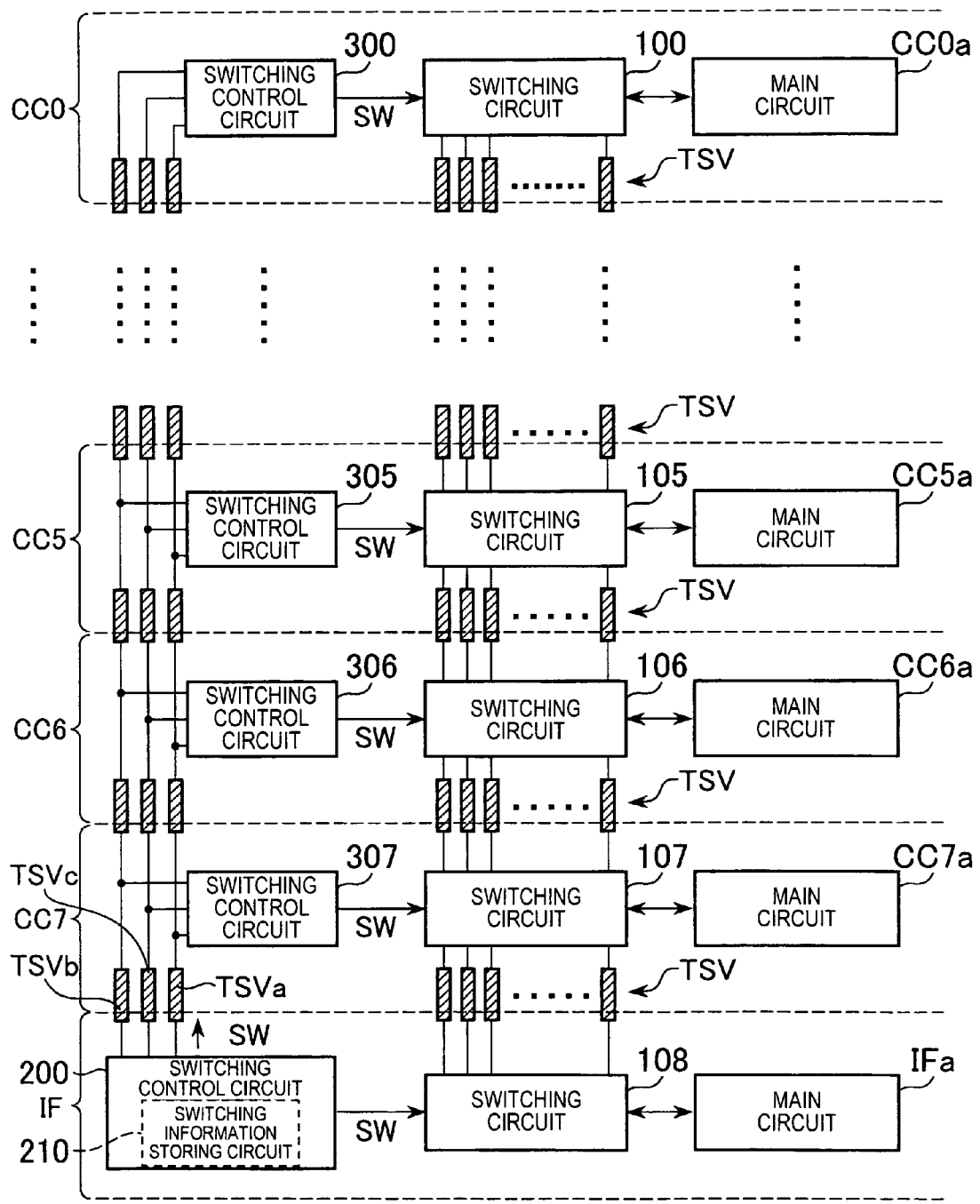
FIG. 4 is a block diagram of parts that are relevant to the switching of the through silicon vias TSV.

FIG. 4 is a block diagram of parts that are relevant to the switching of the through silicon vias TSV.

As shown in FIG. 4, a main circuit IFa provided in the interface chip IF and main circuits CC0a to CC7a provided in the core chips CC0 to CC7, respectively, are connected to each other with the through silicon vias TSV. Selection as to which through silicon via TSV is to be used is made by switching circuits 100 to 108. The switching circuits 100 to 108 are specified by a switching control circuit 200 or switching control circuits 300 to 307.

The switching control circuit 200 is a circuit provided in the interface chip IF, and includes a switching information storing circuit 210 that holds the through silicon via switching information described above. When a defective through silicon via TSV is detected after assembly, the through silicon via switching information is written in the switching information storing circuit 210 by an ATE (Automated Test Equipment). As mentioned above, it is required that the through silicon via switching information is nonvolatile. Therefore, the switching information storing circuit 210 uses a nonvolatile memory element, such as an anti-fuse element, to hold the through silicon via switching information in a nonvolatile manner.

Meanwhile, the switching control circuits 300 to 307 are circuits provided in the core chips CC0 to CC7, respectively. The switching control circuits 300 to 307 are different from the switching control circuit 200 in that they do not include the switching information storing circuit 210. Through silicon via switching information SW is transferred from the switching control circuit 200 provided in the interface chip IF to the switching control circuits 300 to 307 during power up sequence. The transfer of the through silicon via switching information is performed in serial using a through silicon via TSVa for relief data transfer. The transfer operation is explained in detail later. Apart from the through silicon via TSVa, a through silicon via TSVb for load flag signal transfer and a through silicon via TSVc for transfer clock signal transfer are used in the transfer operation.

Figure 5:
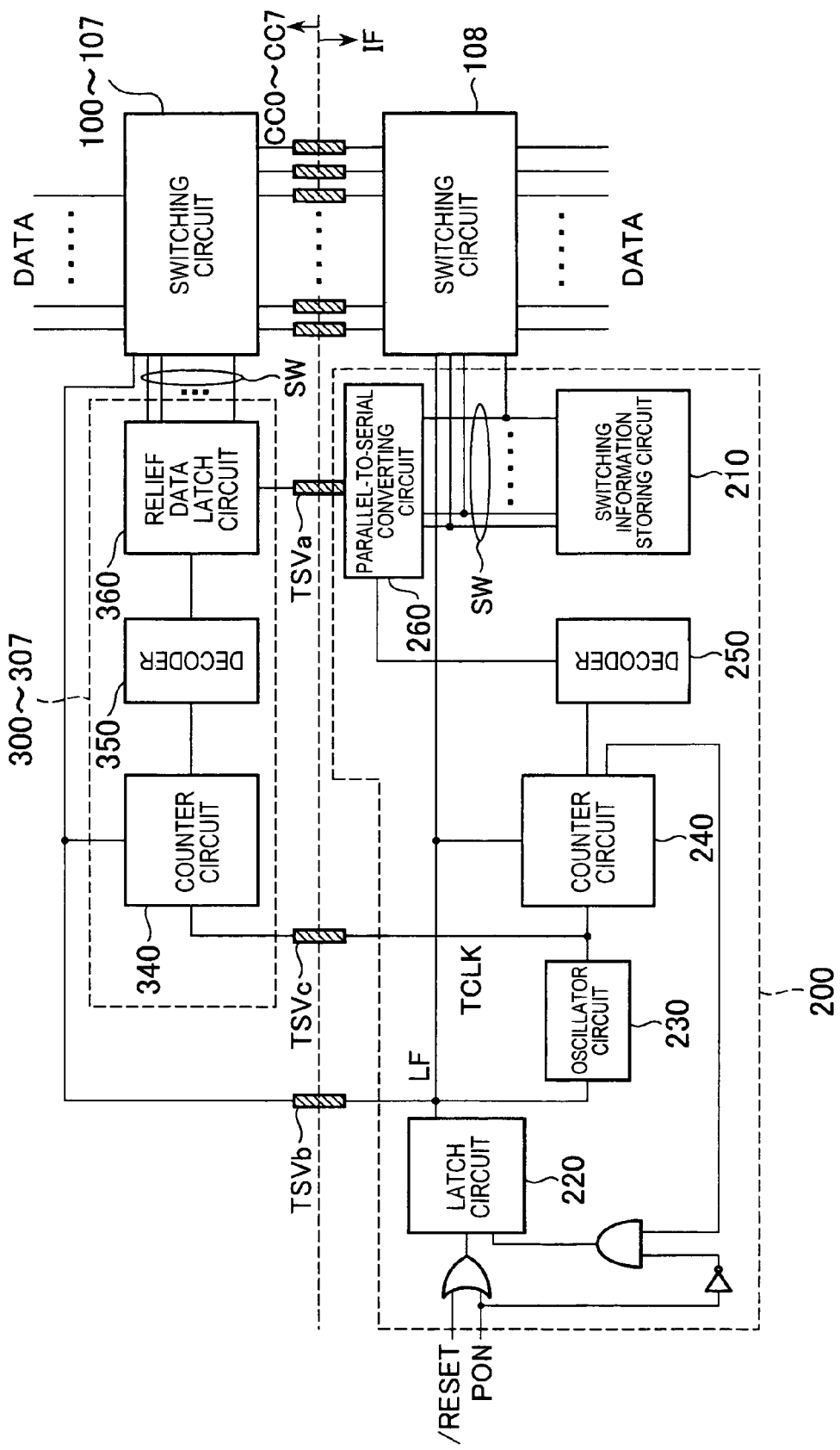
FIG. 5 is a block diagram of the switching control circuit 200 and the switching control circuits 300 to 307 in detail.

FIG. 5 is block diagram of the switching control circuit 200 and the switching control circuits 300 to 307 in detail.

The switching control circuit 200 is provided in the interface chip IF. As shown in FIG. 5, the switching control circuit 200 includes the switching information storing circuit 210, a latch circuit 220, an oscillator circuit 230, a counter circuit 240, a decoder 250, and a parallel-to-serial converting circuit 260.

The latch circuit 220 is an SR latch circuit that is set by a rising edge of a logical sum signal of a reset signal /RESET and a power-on detection signal PON, and reset by a falling edge of a logical product signal of an inverted signal of the power-on detection signal PON and an output of the counter circuit 240. An output of the latch circuit 220 is used as a load flag signal LF. The load flag signal LF is a signal that becomes active to a high level during the transfer operation of the through silicon via switching information SW. The load flag signal LF is supplied to the oscillator circuit 230 and the counter circuit 240. In addition, the load flag signal LF is supplied to the core chips CC0 to CC7 via the through silicon via TSVb for load flag signal transfer.

The oscillator circuit 230 is a circuit that generates a transfer clock signal TCLK in the period in which the load flag signal LF is active. The transfer clock signal TCLK is supplied to the counter circuit 240 as well as to the core chips CC0 to CC7 via the through silicon via TSVc for transfer clock signal transfer. The counter circuit 240 performs a counting operation in synchronization with the transfer clock signal TCLK, and supplies the obtained count value to the decoder 250.

The decoder 250 is a circuit that decodes the count value, which is in a binary format, counted by the counter circuit 240. The decoder 250 supplies the obtained value to the parallel-to-serial converting circuit 260. The parallel-to-serial converting circuit 260 converts the parallel through silicon via switching information SW read from the switching information storing circuit 210 to a serial value. The serial through silicon via switching information SW is supplied to each of the core chips CC0 to CC7 via the through silicon via TSVa for relief data transfer. On the other hand, the parallel through silicon via switching information SW in the switching information storing circuit 210 is supplied as it is to a switching circuit 108. The switching circuit 108 selects the through silicon via to be used based on the parallel through silicon via switching information SW. The switching circuit 108 is explained in detail later.

Meanwhile, the switching control circuits 300 to 307 are provided in the core chips CC0 to CC7, respectively. As shown in FIG. 5, each of the switching control circuits 300 to 307 includes a counter circuit 340, a decoder 350, and a relief data latch circuit 360.

The counter circuit 340 is structurally similar to the counter circuit 240 provided in the interface chip IF. The counter circuit 340 performs a counting operation in synchronization with the transfer clock signal TCLK received via the through silicon via TSVc, and supplies the obtained count value to the decoder 350. The decoder 350 is structurally similar to the decoder 250 provided in the interface chip IF. The decoder 350 decodes the count value, which is in a binary format, counted by the counter circuit 340. The decoder 350 supplies the obtained value to the relief data latch circuit 360. The relief data latch circuit 360 includes a plurality of latch circuits. The relief data latch circuit 360 latches the received serial through silicon via switching information SW based on the output of the decoder 350, converts the serial through silicon via switching information to a parallel value, and supplies the parallel through silicon via switching information SW to the switching circuits 100 to 107. The switching circuits 100 to 107 are explained in detail later.

In this structure, the switching control circuit 200 provided in the interface chip IF, and the switching control circuits 300 to 307 provided in the core chips CC0 to CC7 perform their respective operations in synchronization with the transfer clock signal TCLK and in association with each other.

The operations of the switching control circuit 200 and the switching control circuits 300 to 307 are explained below.

During power up sequence (during initial sequence), the /RESET signal is asserted to a low level for a predetermined period. When the /RESET signal changes to a high level, the latch circuit 220 is set, and the load flag signal LF becomes active to a high level. As a result, the transfer clock signal TCLK is generated by the oscillator circuit 230. As mentioned above, the transfer clock signal TCLK is supplied to the counter circuits 240 and 340 that perform the counting operations in synchronization with the transfer clock signal TCLK. Thus, the count values of the counter circuits 240 and 340 are always the same. The count values of the counter circuits 240 and 340 are decoded by the decoders 250 and 350, respectively. Therefore, the outputs of the decoders 250 and 350 are also the same.

The output of the decoder 250 is used to identify each bit of the parallel through silicon via switching information SW, whereas the output of the decoder 350 is used to identify each bit of the serial through silicon via switching information SW. That is, the parallel-to-serial converting circuit 260 selects the bit corresponding to the parallel through silicon via switching information SW based on the output of the decoder 250, and supplies the selected bit to the core chips CC0 to CC7 via the through silicon via TSVa for relief data transfer. Thus, the parallel through silicon via switching information SW is transferred in serial bit by bit to the core chips CC0 to CC7 in association with the transfer clock signal TCLK. On the side of the core chips CC0 to CC7, the relief data latch circuit 360 holds each bit of the through silicon via switching information SW in the latch circuit corresponding to the output of the decoder 350. Therefore, the through silicon via switching information SW supplied in serial and in association with the transfer clock signal TCLK is latched bit by bit in corresponding latch circuits.

Due to this, when the counter circuits 240 and 340 count up to the number of bits in the through silicon via switching information SW, the entire through silicon via switching information SW held in the switching information storing circuit 210 of the interface chip IF is transferred to the relief data latch circuit 360 of each of the core chips CC0 to CC7.

In the present invention, it is not essential that the through silicon via switching information SW is transferred in serial. However, when the through silicon via switching information SW is transferred in parallel, there is a disadvantage in that the number of through silicon vias TSVa for relief data transfer increases. Therefore, keeping this point in mind, the through silicon via switching information is transferred in serial in the present embodiment.

It is also not essential in the present invention that the counter circuit 340 is provided in the core chips CC0 to CC7. However, when the count value of the counter circuit 240 is transferred to the core chips CC0 to CC7, there is a disadvantage that more through silicon vias will be required for transfer. Therefore, keeping this point in mind, each of the core chips CC0 to CC7 is provided with a counter circuit 340 in the present embodiment.

When the transfer of the through silicon via switching information SW is completed, that is, when the counter circuit 240 has counted up to a predetermined number, the latch circuit 220 is reset, and the load flag signal LF becomes inactive to a low level. The load flag signal LF is supplied to the switching circuit 108 as well as to the switching circuits 100 to 107 of the core chips CC0 to CC7 via the through silicon via TSVb for load flag signal transfer. When the load flag signal LF is inactive, the switching circuits 100 to 108 perform switching operations based on the through silicon via switching information SW, and due to this, data DATA is transferred via the through silicon vias TSV. The data DATA is a signal that is input to and output from the main circuits IFa and CC0a to CC7a shown in FIG. 4.

Figure 6:
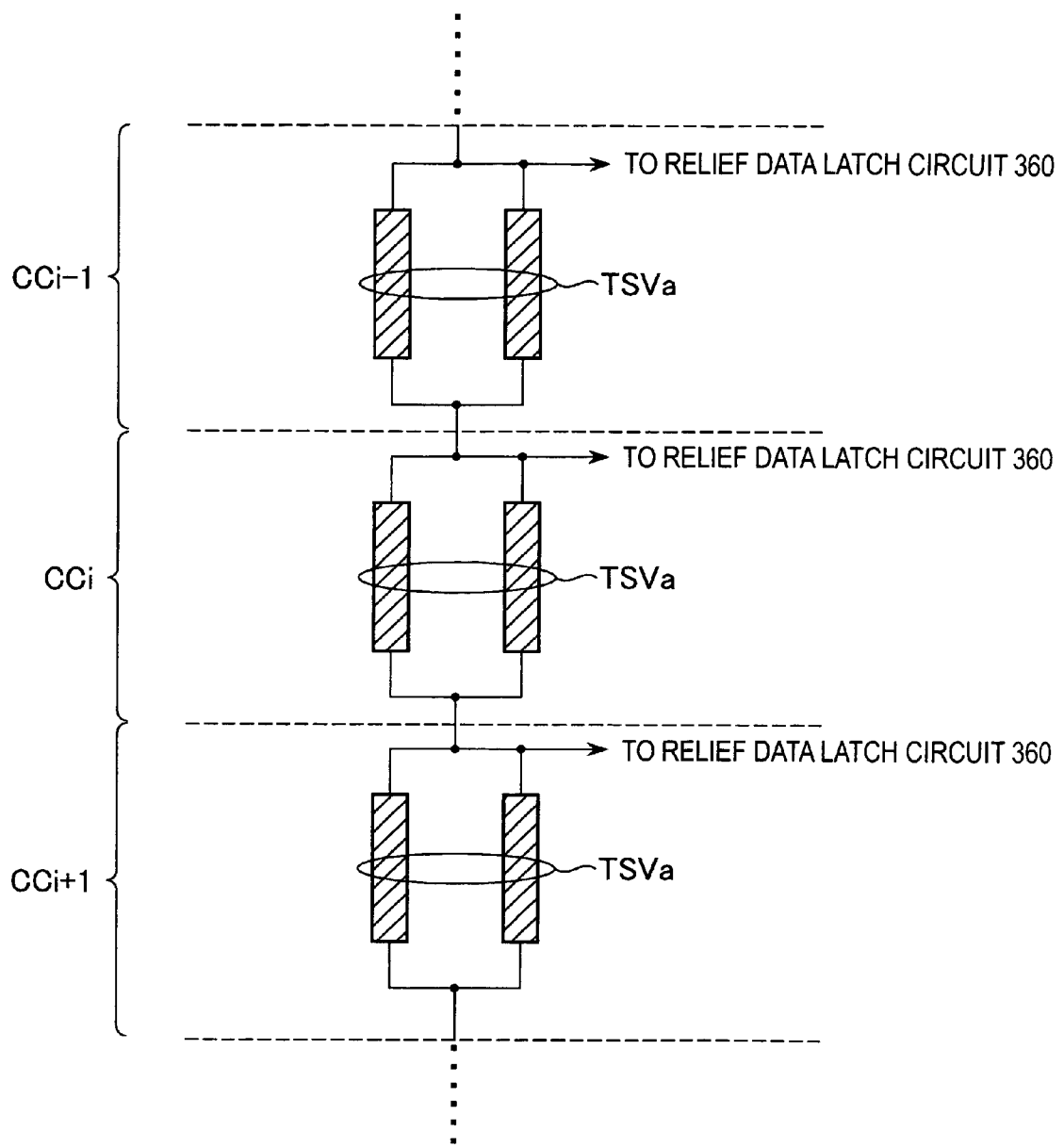
FIG. 6 is a diagram showing an example in which two through silicon vias TSVa for relief data transfer have been connected in parallel.

No replacement is possible if any of the through silicon vias TSVa for relief data transfer, through silicon via TSVb for load flag signal transfer, or through silicon via TSVc for transfer clock signal transfer becomes defective. Therefore, it is preferable that the through silicon vias TSVa, TSVb, and TSVc are configured by connecting a plurality of through silicon vias in parallel. FIG. 6 shows an example in which two through silicon vias TSVa for relief data transfer have been connected in parallel.

Figure 7:
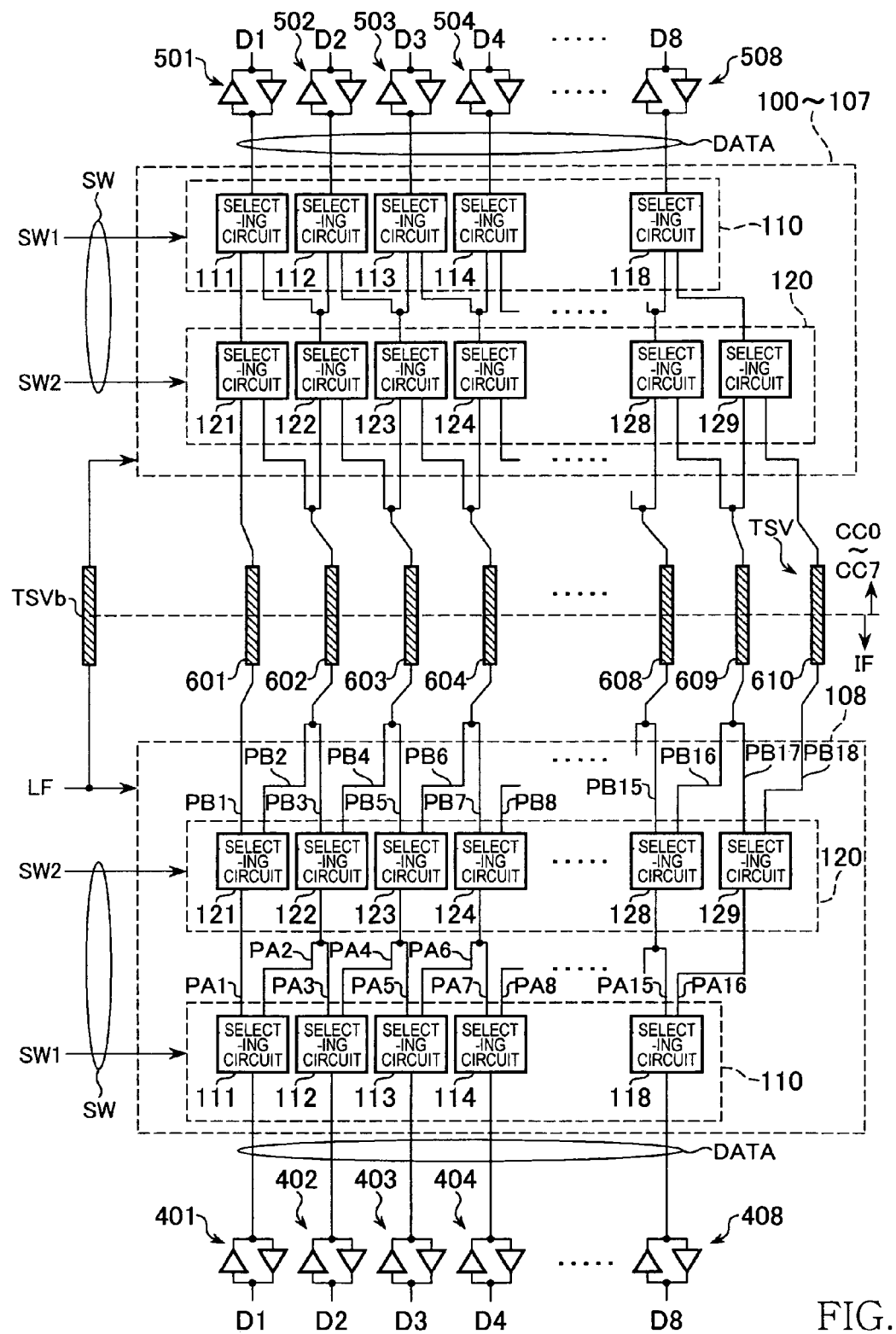
FIG. 7 is a circuit diagram of the switching circuits 100 to 108.

FIG. 7 is a circuit diagram of the switching circuits 100 to 108. In the example shown in FIG. 7, the data DATA transferred between the interface chip IF and each of the core chips CC0 to CC7 is an 8-bit data D1 to D8.

As shown in FIG. 7, eight buffer circuits 401 to 408 corresponding to the data D1 to D8, respectively, are provided in the interface chip IF, and eight buffer circuits 501 to 508 corresponding to the data D1 to D8, respectively, are provided in each of the core chips CC0 to CC7. In the present embodiment, ten (8+2) through silicon vias 601 to 610 are provided for connecting the buffer circuits 401 to 408 and the buffer circuits 501 to 508. Among the through silicon vias 601 to 610, the through silicon vias 609 and 610 are auxiliary through silicon vias, and are not used when no defect occurs to any of the through silicon vias 601 to 608. It is shown in FIG. 7 that driver circuits are bi-directional buffers. However, for signals such as an address signal or a command signal, which are unidirectional, that is, supplied from the interface chip IF to the core chips CC0 to CC7, the driver circuits can be provided in the interface chip IF and receiver circuits can be provided in the core chips CC0 to CC7.

The switching circuit 108 provided in the interface chip IF includes selecting circuit groups 110 and 120. The selecting circuit group 110 constituted by selecting circuits 111 to 118. Each of the selecting circuits 111 to 118 connects an input/output terminal of corresponding one of the buffer circuits 401 to 408 to any one of two corresponding paths among paths PA1 to PA16. The selecting circuits 111 to 118 are made of transfer gates and the like, which become conductive exclusively. The operation of the selecting circuits 111 to 118 is determined by a relief signal SW1, which is a part of the through silicon via switching information SW.

The relief signal SW1 is a signal that switches the operation of the selecting circuits 111 to 118 when one or two through silicon vias are defective among the eight through silicon vias 601 to 608. Specifically, when one through silicon via 60x or two through silicon vias 60x and 60y (x<y) are defective, the relief signal SW1 switches the selecting circuits 11x to 118 from odd numbered paths PA to even numbered paths PA. The selecting circuits 111 to 11(x−1) are connected to the odd numbered paths PA. Thus, a connection relation between the buffer circuits 401 to 408 and the paths PA1 to PA16 shifts with the defective through silicon via as a boundary. As shown in FIG. 7, two paths that are connected to different selecting circuits of the selecting circuit group 110 (for example, the paths PA2 and PA3) are wired-ORed and connected to the selecting circuit group 120.

The selecting circuit group 120 is constituted by selecting circuits 121 to 129. Each of the selecting circuits 121 to 129 connects the corresponding paths PA1 to PA16 to any one of two corresponding paths among paths PB1 to PB18. The selecting circuits 121 to 129 are made of transfer gates and the like, which become conductive exclusively. The operation of the selecting circuits 121 to 129 is determined by a relief signal SW2, which is a part of the through silicon via switching information SW.

The relief signal SW2 is a signal that switches the operation of the selecting circuits 121 to 129 when one or two through silicon vias are defective among the nine through silicon vias 601 to 609. Specifically, when two through silicon vias 60x and 60y (x<y) are defective, the relief signal SW2 switches the selecting circuits 12y to 129 from odd numbered paths PB to even numbered paths PB. The selecting circuits 121 to 12(y−1) are connected to the odd numbered paths PB. Thus, a connection relation between the buffer circuits 401 to 408 and the paths PB1 to PB18 shifts with the second defective through silicon via as a boundary. As shown in FIG. 7, two paths that are connected to different selecting circuits of the selecting circuit group 120 (for example, the paths PB2 and PB3) are wired-ORed and connected to corresponding one of the through silicon vias 601 to 610.

With this structure, when one of the eight through silicon vias 601 to 608 is defective, the through silicon vias that can be used are shifted with the defective through silicon via as a boundary, and the auxiliary through silicon via 609 is used. When two of the nine through silicon vias 601 to 609 are defective, the through silicon vias that can be used are shifted once again, this time with the second defective through silicon via as a boundary, and this time the auxiliary through silicon via 610 is used.

The switching circuits 100 to 107 provided in the core chips CC0 to CC7, respectively, also have the same circuit configuration as the switching circuit 108 provided in the interface chip IF, and the relief signals SW1 and SW2 having the same values are supplied to them. Thus, because the switching circuits 100 to 108 perform the same switching operations mutually, the buffer circuits 401 to 408 provided in the interface chip IF and the buffer circuits 501 to 508 provided in the core chips CC0 to CC7 are connected to each other via non-defective through silicon vias. Because the corresponding through silicon vias provided in the core chip CC0 to CC7 are mutually short-circuited, the through silicon via selected by the switching circuit 100 and the through silicon vias selected by the switching circuits 100 to 106 are commonly connected. Further, the through silicon via selected by the switching circuit 107 provided in the core chip CC7 provided at the lowest level is the same as the through silicon via selected by the switching circuit 108 provided in the interface chip IF. The defective through silicon via and through silicon vias connected to the defective through silicon via are not selected by any of the switching circuits 100 to 108.

Figure 8:
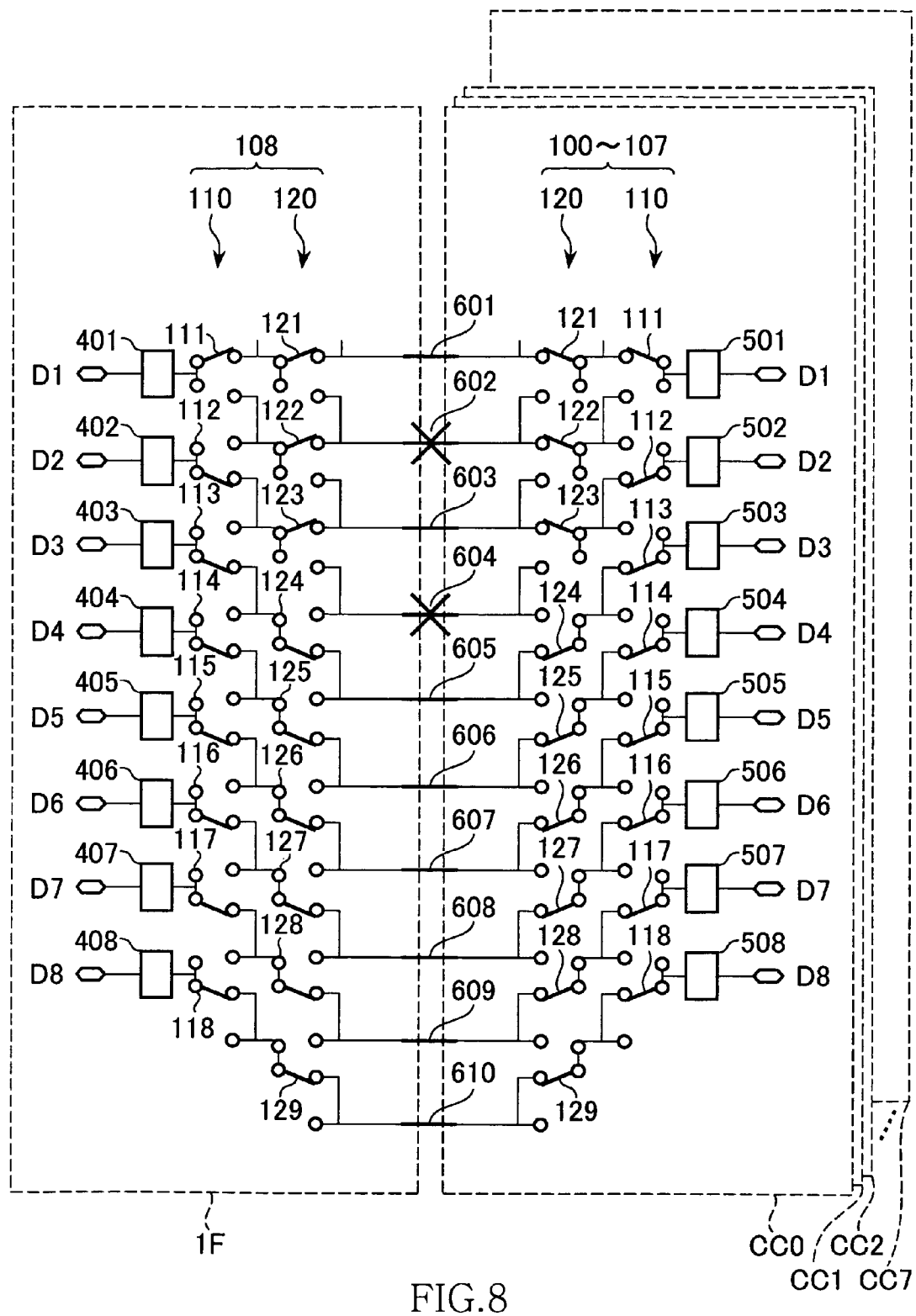
FIG. 8 is a schematic diagram for explaining the operations of the switching circuits 100 to 108 when the through silicon vias 602 and 604 are defective.

FIG. 8 is a schematic diagram for explaining the operations of the switching circuits 100 to 108 when the through silicon vias 602 and 604 are defective.

In the example shown in FIG. 8, where two through silicon vias are defective, for the through silicon via having a relatively smaller number, that is, for the through silicon via 602, connections are shifted with the selecting circuit 112 belonging to the selecting circuit group 110 corresponding to the defective through silicon via 602 as a boundary. That is, an odd numbered path (an upper path in FIG. 8) is selected for the selecting circuit 111, and even numbered paths (lower paths in FIG. 8) are selected for the selecting circuits 112 to 118. For the through silicon via 604 that has a relatively larger number, the connections are shifted from the selecting circuit 124 belonging to the selecting circuit group 120 corresponding to the defective through silicon via 604 as a boundary. In other words, the odd numbered paths (upper paths in FIG. 8) are selected for the selecting circuits 121 to 123, and the even numbered paths (lower paths in FIG. 8) are selected for the selecting circuits 124 to 129.

In this manner, the original through silicon via 601 is allocated to the data D1, the through silicon via 603, shifted by one through silicon via, is allocated to the data D2, and the through silicon vias 605 to 610, each shifted by two through silicon vias, are allocated to the data D3 to D8, respectively.

As described above, in the present embodiment, the defective through silicon via is not simply replaced by an auxiliary through silicon via, but the defective through silicon via is bypassed by shifting the connection relation between the buffer circuits 401 to 408 and the through silicon vias 601 to 610, and the connection relation between the buffer circuits 501 to 508 and the through silicon vias 601 to 610 with the defective through silicon via as a boundary. Therefore, as long as the through silicon vias 601 to 610 are arranged sequentially in such a way that an i-th through silicon via and an (i+1)-th through silicon via are adjacent to each other, a difference in the wiring lengths between signal paths before and after replacement will be negligible. By this arrangement, almost no skew is generated due to the replacement, and thus the signal quality is maintained.

However, in the present embodiment, the shifting operation described above is not essential. For example, a defective through silicon via can be simply replaced with an auxiliary through silicon via.

Figure 9:
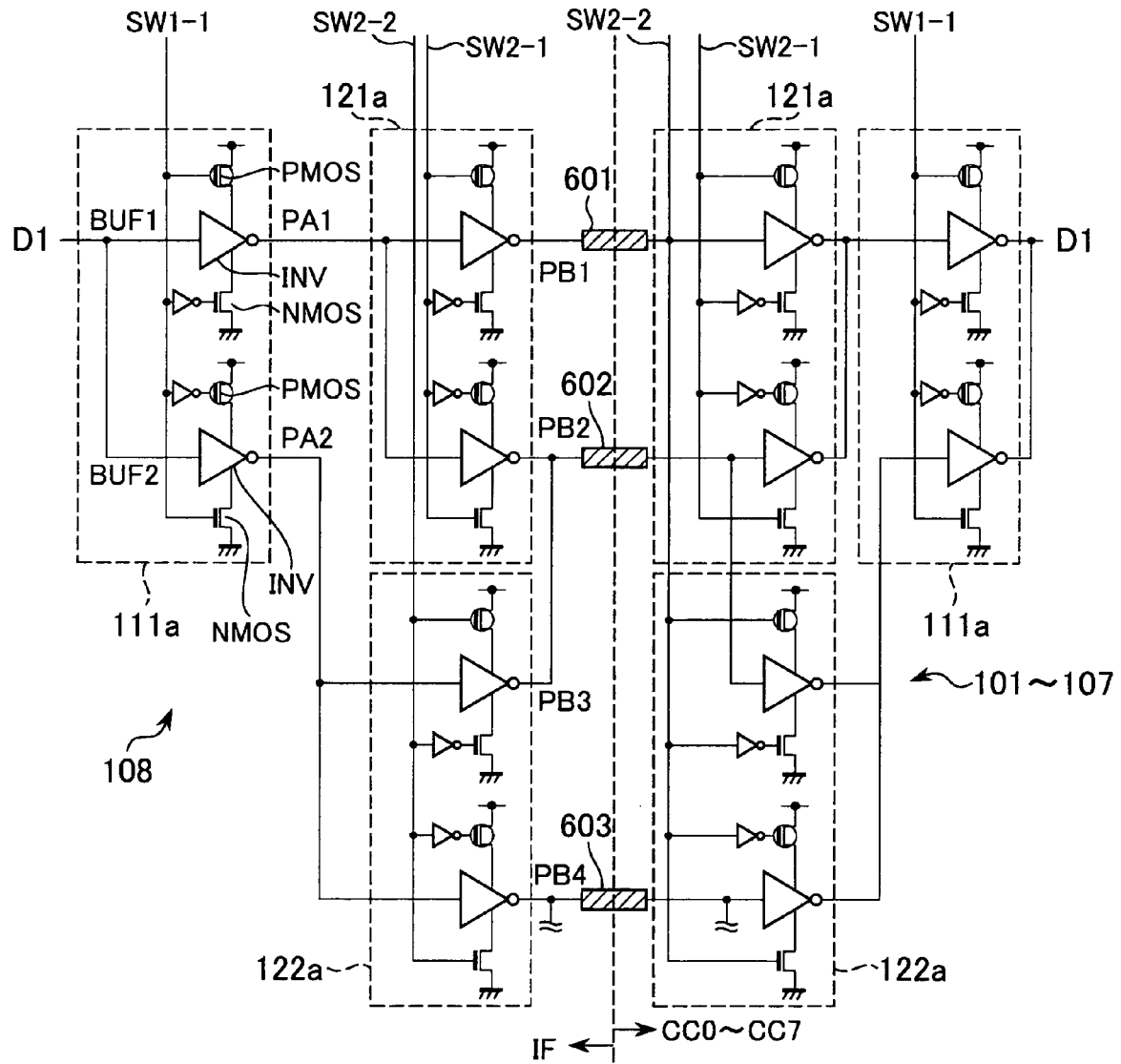
FIG. 9 is a partial circuit diagram of a modification of the switching circuits 100 to 108.

FIG. 9 is a partial circuit diagram of a modification of the switching circuits 100 to 108, showing only a portion related to the data D1. For simplification, the switching circuits 100 to 108 shown in FIG. 9 are circuits that process unidirectional signals, such as the address signal or the command signal, which are transmitted from the interface chip IF to the core chips CC0 to CC7.

In the example shown in FIG. 9, the selecting circuits also serve as the buffer circuits (driver circuits in the interface chip IF, and receiver circuits in the core chips CC0 to CC7). Specifically, in FIG. 9, each of selecting circuits 111a, 121a, and 122a includes two tri-state buffers BUF1 and BUF2 that are activated exclusively. The selecting circuits 111a, 121a, and 122a correspond to the selecting circuits 111, 121, and 122, respectively, shown in FIG. 7.

Each of the tri-state buffers BUF1 and BUF2 includes an inverter INV, a P-channel MOS transistor PMOS, and an N-channel MOS transistor NMOS that supply an operating voltage to the inverter INV. The PMOS and the NMOS are controlled by corresponding bits of the relief signals SW1 and SW2. For example, a corresponding bit SW1-1 of the relief signal SW1 is input into the selecting circuit 111a, and corresponding bits SW2-1 and SW2-2 of the relief signal SW2 are input into the selecting circuits 121a and 122a, respectively. With the input of these bits SW1-1, SW2-1, and SW2-2, either of the tri-state buffers BUF1 and BUF2 in the selecting circuits 111a, 121a, and 122a is activated. The remaining inactivated tri-state buffer is changed to a high impedance state.

The tri-state buffers BUF1 and BUF2 have a common input terminal, and their output terminals are connected to different paths. For example, in the selecting circuit 111a, the output terminal of the tri-state buffer BUF1 is connected to the path PA1, whereas the output terminal of the tri-state buffer BUF2 is connected to the path PA2.

The switching circuits 100 to 107 provided in the core chips CC0 to CC7, respectively, also have the same circuit configuration as the switching circuit 108 provided in the interface chip IF, except that their input and output directions are reversed, and the relief signals SW1 and SW2 having the same values are supplied to them.

Thus, in the example shown in FIG. 9, because the selecting circuits serve as buffer circuits, there is no need to provide transfer gates and the like, which have a relatively large load capacity. Therefore, the quality of the signal passing through the switching circuits 100 to 108 is improved.

A circuit configuration of the semiconductor memory device 10 according to a preferred embodiment is explained below.

Figure 10:
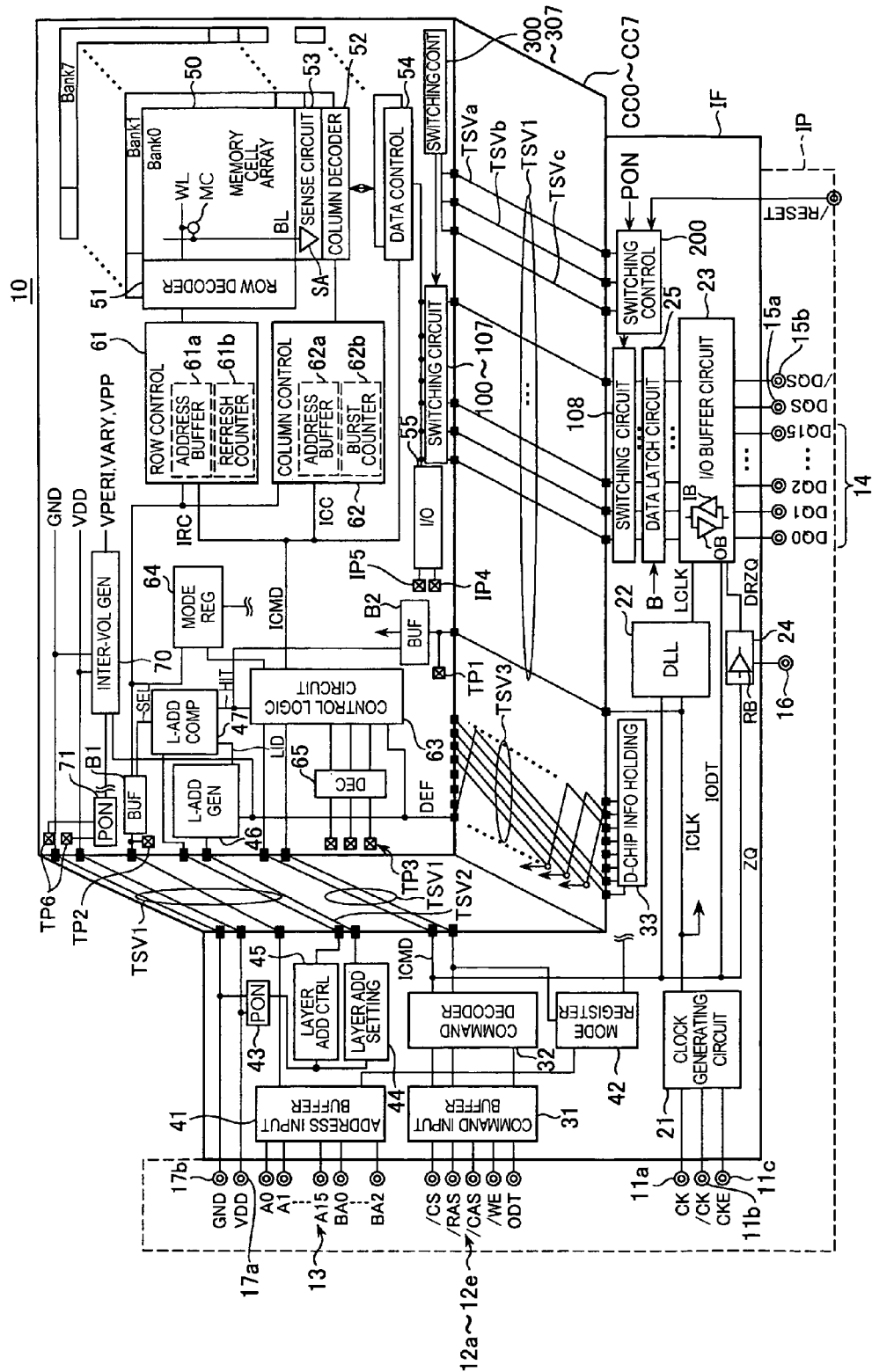
FIG. 10 is a block diagram showing the circuit configuration of the semiconductor memory device 10.

FIG. 10 is a block diagram showing the circuit configuration of the semiconductor memory device 10.

As shown in FIG. 10, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to output read data or input write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7 via through silicon vias TSV and the switching circuit 108, into serial read data, and converts serial write data, which is supplied from the input/output buffer 23, into parallel write data to supply to the core chips CC0 to CC7 via through silicon vias TSV and the switching circuit 108. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in advance to an assembly process of the interface chip and the plural core chips, and the interface chip is only tested by testing the semiconductor memory device 10 after assembling. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 2C.

The interface chip IF is also provided with the switching control circuit 200. The switching control circuit 200 is supplied with the reset signal /RESET from outside. When the reset signal /RESET is activated, the switching control circuit 200 starts the transfer operation of the through silicon via switching information SW described above.

The above description is the outline of the connection relationship between the external terminals and the interface chip IF and the circuit configuration of the interface chip IF. Next, the circuit configuration of the core chips CC0 to CC7 will be described.

As shown in FIG. 10, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 10, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the switching circuit 100 to 107 and the through silicon via TSV.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the through silicon via TSV and a layer address LID (chip identification information) set to the layer address generating circuit 46. When the layer address comparing circuit 47 detects a match, it activates a match signal HIT.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI ($\approx$VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, which includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

In the semiconductor storage device 10 having a structure described above, the switching control circuit 200 is activated in response to a change in the reset signal /RESET that is generated during power up sequence, and the through silicon via switching information SW held in the switching information storing circuit 210 is transferred to the switching circuits 100 to 107 within the core chips CC0 to CC7, respectively. Thus, because there is no need to store the through silicon via switching information SW in a nonvolatile manner within the core chips CC0 to CC7, the chip area of each of the core chips CC0 to CC7 can be reduced.

Figure 11:
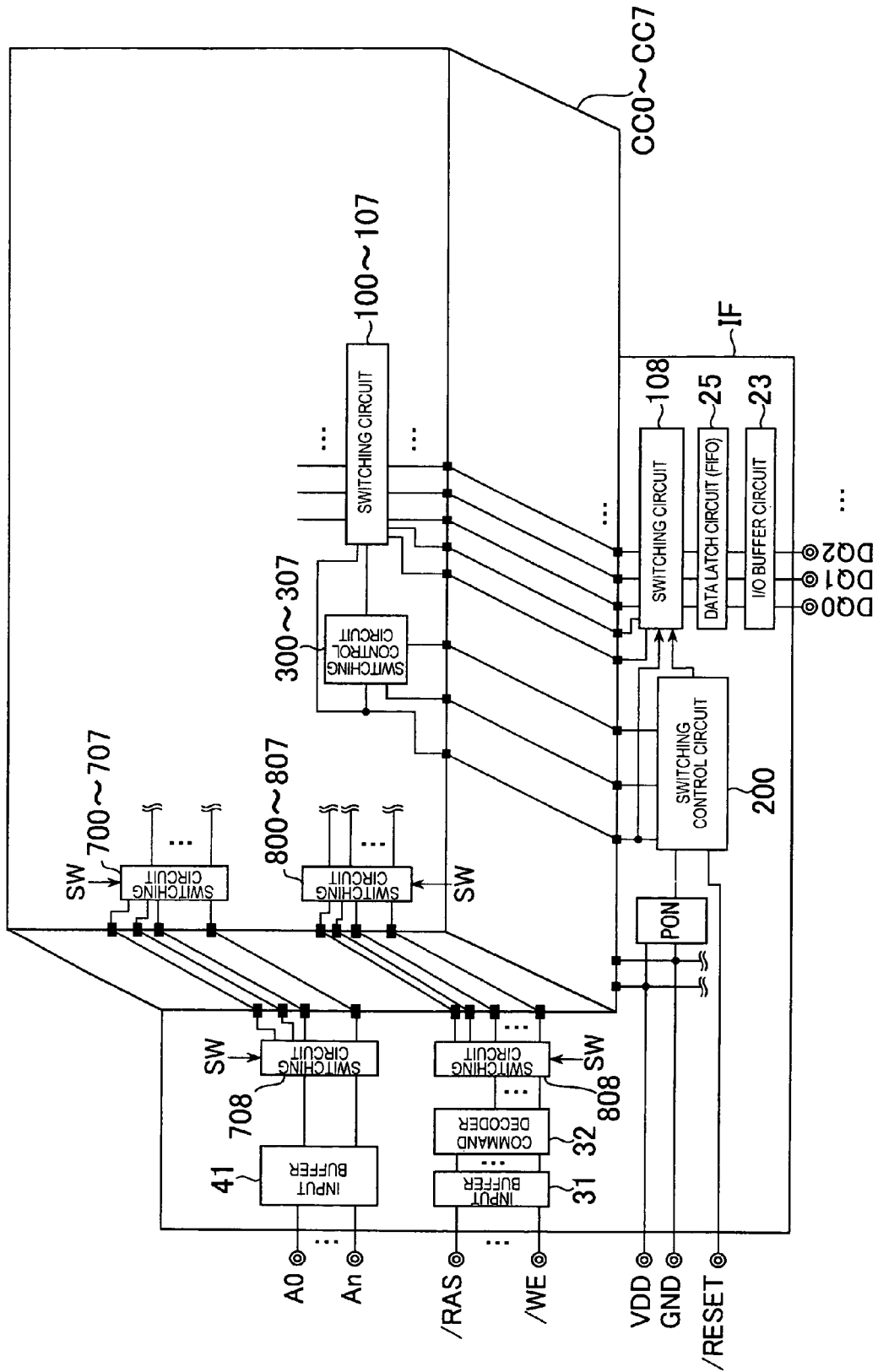
FIG. 11 is a block diagram showing the circuit configuration of main part of the semiconductor memory device 10 according to a modification.

In the example shown in FIG. 10, the switching circuits are only provided in the through silicon via for transferring data signals. However, as shown in FIG. 11, it is preferable to provide switching circuits 700 to 708 and switching circuits 800 to 808 in the through silicon via for transferring other signals, such as the address signal or the command signal.

It is apparent that the present invention is not limited to the above embodiments, but may be modified and changed without departing from the scope and spirit of the invention.

For example, in the above embodiments, a chip-stacked DRAM has been explained as an example. However, in the present invention, the type of semiconductor chips to be stacked is not particularly limited thereto. It can be other memory devices such as an SRAM, a PRAM, an MRAM, an RRAM, and a flash memory, or can be a logical system device such as a CPU and a DSP.

What is claimed is:

1. A semiconductor device comprising:
a plurality of semiconductor chips laminated to each other, the semiconductor chips including at least first and second semiconductor chips; and
a plurality of through silicon vias electrically connected in common to the plurality of semiconductor chips,
wherein the first semiconductor chip stores switching information that specifies one or more of the penetration electrodes to be used for data transfer, and the first semiconductor chip transfers the switching information to the second semiconductor chip,
wherein the first semiconductor chip includes a first switching circuit that selects one or more of the penetration electrodes to be used for data transfer based on the switching information, and the second semiconductor chip includes a second switching circuit that selects one or more of the penetration electrodes to be used for the data transfer based on the switching information transferred from the first semiconductor chip, and
wherein each of the penetration electrodes selected by the first switching circuit is electrically connected to an associated one of the penetration electrodes selected by the second switching circuit.

2. The semiconductor device as claimed in claim 1, wherein a penetration electrode not selected by the first switching circuit is not selected by the second switching circuit either.

3. A semiconductor device comprising:
a plurality of semiconductor chips laminated to each other, the semiconductor chips including at least first and second semiconductor chips; and
a plurality of through silicon vias electrically connected in common to the plurality of semiconductor chips,
wherein the first semiconductor chip stores switching information that specifies one or more of the penetration electrodes to be used for data transfer, and the first semiconductor chip transfers the switching information to the second semiconductor chip,
wherein the first semiconductor chip includes a first switching circuit that selects one or more of the penetration electrodes to be used for data transfer based on the switching information, and the second semiconductor chip includes a second switching circuit that selects one or more of the penetration electrodes to be used for the data transfer based on the switching information transferred from the first semiconductor chip,
wherein the first semiconductor chip further includes:
a switching information storing circuit that stores the switching information; and
a parallel-to-serial converting circuit that converts the switching information read from the switching information storing circuit from parallel to serial and transfers the switching information in serial to the second semiconductor chip, and
wherein the first semiconductor chip further includes a first counter circuit that performs a counting operation in synchronization with a clock signal and a first decoder that decodes a count value of the first counter circuit, and the parallel-to-serial converting circuit performs a parallel-to-serial conversion based on an output signal of the first decoder.

4. The semiconductor device as claimed in claim 3, wherein the second semiconductor chip includes a relief data latch circuit that latches and converts the switching information supplied in serial to parallel, and supplies the switching information in parallel to the second switching circuit.

5. The semiconductor device as claimed in claim 4, wherein
the second semiconductor chip further includes a second counter circuit that performs a counting operation in synchronization with the clock signal and a second decoder that decodes a count value of the second counter circuit, and
the relief data latch circuit performs a latching operation based on an output signal of the second decoder.

6. The semiconductor device as claimed in claim 1, wherein
the first switching circuit includes $1^{st}$ to $n^{th}$ first buffer circuits,
the second switching circuit includes $1^{st}$ to $n^{th}$ second buffer circuits,
the plurality of penetration electrodes includes $1^{St}$ to $n+m^{th}$ penetration electrodes,
the first switching circuit selectively connects each of the $1^{st}$ to $n^{th}$ first buffer circuits to different ones of the $1^{st}$ to $n+m^{th}$ penetration electrodes based on the switching information by connecting an $i^{th}$ first switching circuit to one of $i^{th}$ to $i+m^{th}$ penetration electrodes, where i is an integer among 1 to n, and
the second switching circuit selectively connects each of the $1^{st}$ to $n^{th}$ second buffer circuits to different ones of the $1^{st}$ to $n+m^{th}$ penetration electrodes based on the switching information by connecting an $i^{th}$ second switching circuit to one of $i^{th}$ to $i+m^{th}$ penetration electrodes.

7. The semiconductor device as claimed in claim 6, wherein
the first switching circuit further includes a plurality of first tri-state buffers provided between the $i^{th}$ first switching circuit and each of the $i^{th}$ to $i+m^{th}$ penetration electrodes,
the second switching circuit further includes a plurality of second tri-state buffers provided between the $i^{th}$ second switching circuit and each of the $i^{th}$ to $i+m^{th}$ penetration electrodes,
the first switching circuit activates one of the first tri-state buffers provided between the $i^{th}$ first switching circuit and the $i^{th}$ to $i+m^{th}$ penetration electrodes based on the switching information, and
the second switching circuit activates one of the second tri-state buffers provided between the $i^{th}$ second switching circuit and the $i^{th}$ to $i+m^{th}$ penetration electrodes based on the switching information.

8. A semiconductor device comprising:
a first semiconductor chip that includes $1^{st}$ to $n^{th}$ first buffer circuits;
a second semiconductor chip stacked on the first semiconductor chip, and including $1^{st}$ to $n^{th}$ second buffer circuits;
$1^{st}$ to $n+m^{th}$ first penetration electrodes provided in the first semiconductor chip or the second semiconductor chip; and
at least one second penetration electrode provided in the first semiconductor chip or the second semiconductor chip, wherein
the first semiconductor chip includes a switching information storing circuit that stores switching information for specifying n units of first penetration electrodes among the $1^{st}$ to $n+m^{th}$ first penetration electrodes and a first switching circuit that connects each of specified n units of the first penetration electrodes to an associated one of the $1^{st}$ to $n^{th}$ first buffer circuits based on the switching information, and
the second semiconductor chip includes a second switching circuit that connects each of specified n units of the first penetration electrodes to an associated one of the $1^{st}$ to $n^{th}$ second buffer circuits based on the switching information transferred from the switching information storing circuit via the second penetration electrode.

9. The semiconductor device as claimed in claim 8, wherein
the first semiconductor chip further includes a parallel-to-serial converting circuit that converts the switching information read from the switching information storing circuit from parallel to serial, and
the switching information is transferred in serial to the second semiconductor chip via the second penetration electrode.

10. The semiconductor device as claimed in claim 8, wherein
a plurality of the second penetration electrodes that are connected in parallel are provided, and
the switching information is transferred from the first semiconductor chip to the second semiconductor chip vias connected in parallel.

11. The semiconductor device as claimed in claim 8, wherein
the first switching circuit selectively connects each of the $1^{st}$ to $n^{th}$ first buffer circuits to different ones of the $1^{st}$ to $n+m^{th}$ penetration electrodes based on the switching information by connecting an $i^{th}$ first switching circuit to one of $i^{th}$ to $i+m^{th}$ penetration electrodes, where i is an integer among 1 to n, and
the second switching circuit selectively connects each of the $1^{st}$ to $n^{th}$ second buffer circuits to different ones of the $1^{st}$ to $n+m^{th}$ penetration electrodes based on the switching information by connecting an $i^{th}$ second switching circuit to one of $i^{th}$ to $i+m^{th}$ penetration electrodes.

12. The semiconductor device as claimed in claim 11, wherein
the first switching circuit further includes a plurality of first tri-state buffers provided between the $i^{th}$ first switching circuit and each of the $i^{th}$ to $i+m^{th}$ penetration electrodes,
the second switching circuit further includes a plurality of second tri-state buffers provided between the $i^{th}$ second switching circuit and each of the $i^{th}$ to $i+m^{th}$ penetration electrodes,
the first switching circuit activates one of the first tri-state buffers provided between the $i^{th}$ first switching circuit and the $i^{th}$ to $i+m^{th}$ through silicon vias based on the switching information, and
the second switching circuit activates one of the second tri-state buffers provided between the $i^{th}$ second switching circuit and the $i^{th}$ to $i+m^{th}$ penetration electrodes based on the switching information.

13. The semiconductor device as claimed in claim 8, wherein
a plurality of the second semiconductor chips are provided,
the first penetration electrodes and the second penetration electrode are provided on each of the second semiconductor chips, and
the penetration electrodes provided on each of the second semiconductor chips are electrically connected to corresponding ones of the penetration electrodes provided on other of the second semiconductor chips.

14. A semiconductor device comprising:
a first semiconductor chip, which comprises,
a semiconductor substrate comprising a first main surface and a second main surface opposite to the first main surface,
a plurality of penetration electrodes each penetrating the semiconductor substrate from the first main surface to the second main surface and including a first end portion on a side of the first main surface and a second end portion on a side of the second main surface,
a plurality of first buffer circuits formed on the side of the second main surface,
a first switch circuit formed on the side of the second main surface, the first switch circuit being provided between the second end portions of the penetration electrodes and the first buffer circuits, and a second semiconductor chip mounted on the side of first main surface of the semiconductor substrate of the first semiconductor chip, which comprises, a plurality of second buffer circuits provided correspondingly to the first buffer circuits such that each of the second buffer circuits drives a signal which is driven by an associated one of the first buffer circuits, a second switch circuit provided between the first end portions of the penetration electrodes and the second buffer circuits, and the first and second switch circuits being controlled in common by a switch signal to select ones of the penetration electrodes to make electrical paths each formed between the one of the first buffer circuits and the associated one of the second buffer circuits.

15. The semiconductor device as claimed in claim 14, wherein the first semiconductor chip further comprises an additional penetration electrode penetrating the semiconductor substrate from the first main surface to the second main surface, and the switch signal being transferred to the second switch circuit of the second semiconductor chip by way of the additional penetration electrode.

16. The semiconductor device as claimed in claim 14, wherein the first and second switch circuit are controlled in common by the switch signal to make non-selected one or ones of the penetration electrodes high impedance.

17. The semiconductor device as claimed in claim 15, wherein the second switch circuit includes a first circuit portion controlled by a first control bit of the switch signal and a second circuit portion controlled by a second control bit of the switch signal, the first and second control bits of the switch signal being transferred in series through the additional penetration electrode.

18. The semiconductor device as claimed in claim 17, wherein the second semiconductor chip includes a serial-to-parallel conversion circuit electrically coupled to the additional penetration electrode of the first semiconductor chip, the serial-to-parallel conversion circuit receiving the first and second control bits in series and outputting the first and second control bits in parallel to the second switch circuit.

19. The semiconductor device as claimed in claim 15, wherein the first semiconductor chip further comprises another additional penetration electrode penetrating the semiconductor substrate from the first main surface to the second main surface, the switch signal being transferred to the second switch circuit of the second semiconductor chip by way of a parallel electrical path formed by the additional penetration electrode and the another additional penetration electrode.

* * * * *

UNITED STATES PATENT AND TRADEMARK OFFICE
CERTIFICATE OF CORRECTION

PATENT NO.         : 8,310,382 B2               Page 1 of 1
APPLICATION NO.    : 12/923826
DATED              : November 13, 2012
INVENTOR(S)        : Akira Ide et al.

It is certified that error appears in the above-identified patent and that said Letters Patent is hereby corrected as shown below:

Title Page

Foreign Application Priority Data item (30), replace the "September 10, 2009" with "October 9, 2009".

Signed and Sealed this
Seventeenth Day of February, 2015

Michelle K. Lee
*Deputy Director of the United States Patent and Trademark Office*